(12) United States Patent
Aoki et al.

(10) Patent No.: US 10,228,625 B2
(45) Date of Patent: Mar. 12, 2019

(54) MOVABLE BODY APPARATUS, PATTERN FORMING APPARATUS AND PATTERN FORMING METHOD, DEVICE MANUFACTURING METHOD, MANUFACTURING METHOD OF MOVABLE BODY APPARATUS, AND MOVABLE BODY DRIVE METHOD

(71) Applicant: NIKON CORPORATION, Tokyo (JP)

(72) Inventors: Yasuo Aoki, Zushi (JP); Hiroshi Shirasu, Yokohama (JP); Yoshihiko Kudo, Tokyo (JP)

(73) Assignee: NIKON CORPORATION, Tokyo (JP)

(*) Notice: Subject to any disclaimer, the term of this patent is extended or adjusted under 35 U.S.C. 154(b) by 0 days.

(21) Appl. No.: 15/153,244

(22) Filed: May 12, 2016

(65) Prior Publication Data

US 2016/0259255 A1 Sep. 8, 2016

Related U.S. Application Data

(63) Continuation of application No. 12/553,549, filed on Sep. 3, 2009, now Pat. No. 9,366,974, which is a
(Continued)

(30) Foreign Application Priority Data

Mar. 5, 2007 (JP) ................................. 2007-054442

(51) Int. Cl.
*G03B 27/52* (2006.01)
*G03B 27/42* (2006.01)
(Continued)

(52) U.S. Cl.
CPC ...... *G03F 7/70758* (2013.01); *G03F 7/70716* (2013.01); *G03F 7/70791* (2013.01); *H01L 21/682* (2013.01)

(58) Field of Classification Search
CPC ............ G03F 7/70716; G03F 7/70758; G03F 7/70791; G03F 7/70875; G03F 7/70816;
(Continued)

(56) References Cited

U.S. PATENT DOCUMENTS 5,448,332 A  9/1995 Sakakibara et al.
6,778,257 B2  8/2004 Bleeker et al.
(Continued)

FOREIGN PATENT DOCUMENTS

JP  2001-313250 A  11/2001
JP  2002-006110 A  1/2002
(Continued)

OTHER PUBLICATIONS

Nov. 26, 2014 Office Action issued in Korean Application No. 10-2009-7020433.
(Continued)

*Primary Examiner* — Mesfin T Asfaw
(74) *Attorney, Agent, or Firm* — Oliff PLC

(57) ABSTRACT

A substrate stage and an empty-weight canceling mechanism that supports an empty weight of the substrate stage are made up of separate bodies. Accordingly, the size and weight of the substrate stage (a structure including the substrate stage) can be reduced, compared with the case where the substrate stage and the empty-weight canceling mechanism are integrally configured. Further, due to movement of an X coarse movement stage and a Y coarse movement stage by an X drive mechanism and a Y drive mechanism, the substrate stage is driven in an XY plane and also the empty-weight canceling mechanism that supports the empty weight of the substrate stage is driven. With this operation, the substrate stage can be driven without difficulty even when the substrate stage and the empty-weight canceling mechanism are configured of separate bodies.

21 Claims, 11 Drawing Sheets

Related U.S. Application Data continuation of application No. PCT/JP2008/000437, filed on Mar. 4, 2008.

(51) Int. Cl.
*G03F 7/20* (2006.01)
*H01L 21/68* (2006.01)

(58) Field of Classification Search
CPC .. H01L 21/682; F16C 29/025; F16C 32/0603; F16C 33/748
See application file for complete search history.

(56) References Cited

U.S. PATENT DOCUMENTS

| | | |
|---|---|---|
| 6,952,254 B2 | 10/2005 | Korenaga |
| 2001/0033490 A1 | 10/2001 | Koyama et al. |
| 2003/0007140 A1 | 1/2003 | Korenaga |
| 2003/0025890 A1 | 2/2003 | Nishinaga |
| 2004/0246455 A1 | 12/2004 | Emoto |
| 2005/0185167 A1 | 8/2005 | Kimura |
| 2005/0259234 A1 | 11/2005 | Hirukawa et al. |
| 2006/0132737 A1 | 6/2006 | Magome et al. |
| 2006/0187437 A1 | 8/2006 | Emoto |

FOREIGN PATENT DOCUMENTS

| | | |
|---|---|---|
| JP | 2003-022960 A | 1/2003 |
| JP | 2004-130312 A | 4/2004 |
| JP | 2004-363259 A | 12/2004 |
| JP | 2005-243751 A | 9/2005 |
| JP | 2006-086442 A | 3/2006 |
| JP | 2006-203113 A | 8/2006 |
| JP | 2006-224237 A | 8/2006 |
| JP | 2006-253572 A | 9/2006 |
| WO | 2004/053955 A1 | 6/2004 |

OTHER PUBLICATIONS

Apr. 20, 2015 Notice of Reasons for Rejection issued in Japanese Application No. 2013-270866.
Feb. 26, 2013 Office Action issued in Japanese Patent Application No. 2009-510750.
Oct. 3, 2014 Notification of Reasons for Refusal issued in Japanese Patent Application No. 2013-270866.
Aug. 27, 2013 Office Action issued in Taiwanese Patent Application No. 097107730.
Apr. 29, 2014 Office Action issued in Taiwanese Patent Application No. 097107730.
Jun. 10, 2008 Written Opinion issued in PCT Application No. PCT/JP2008/000437.
Jun. 10, 2008 Search Report issued in International Patent Application No. PCT/JP2008/000437.
Mar. 21, 2011 Office Action issued in Chinese Patent Application No. 200880004910.X.
Aug. 25, 2014 Office Action issued in U.S. Appl. No. 12/553,549.
Feb. 17, 2012 Office Action issued in U.S. Appl. No. 12/553,549.
Mar. 10, 2015 Office Action issued in U.S. Appl. No. 121553,549.
Nov. 9, 2012 Office Action issued in U.S. Appl. No. 12/553,549.
Feb. 17, 2016 Notice of Allowance issued in U.S. Appl. No. 12/553,549.

MOVABLE BODY APPARATUS, PATTERN FORMING APPARATUS AND PATTERN FORMING METHOD, DEVICE MANUFACTURING METHOD, MANUFACTURING METHOD OF MOVABLE BODY APPARATUS, AND MOVABLE BODY DRIVE METHOD

CROSS-REFERENCE TO RELATED APPLICATIONS

This application is a continuation application of U.S. patent application Ser. No. 12/553,549, which was filed on Sep. 3, 2009, which is in turn a continuation of International Application PCT/JP2008/000437, with an international filing date of Mar. 4, 2008, which was not published in English, the disclosures of which are hereby incorporated herein by reference in their entirety.

BACKGROUND OF THE INVENTION

Field of the Invention

The present invention relates to movable body apparatus, pattern forming apparatus and pattern forming methods, device manufacturing methods, manufacturing methods of movable body apparatus and movable body drive methods, and more particularly to a movable body apparatus equipped with a movable body that can move, a pattern forming apparatus to form a pattern on an object and a pattern forming method using the pattern forming apparatus, a device manufacturing method using the pattern forming method, a method of manufacturing the movable body apparatus, and a movable body drive method to drive the movable body.

Description of the Background Art

Conventionally, in a process or the like of manufacturing glass substrates such as liquid crystal displays (flat-panel displays), a processing apparatus, e.g. an exposure apparatus or the like is used.

In this type of exposure apparatus, a stage device, which is equipped with a stage that two-dimensionally moves while holding a substrate serving as an object to be exposed, and a drive mechanism that drives the stage, is used (e.g. refer to Kokai (Japanese Patent Unexamined Application Publication) No. 2006-203113).

However, in the case of this type of stage device, as the substrate grows in size, the entire stage that holds the substrate also grows in size accordingly. There is a risk that such increase in size of the substrate makes a stroke of the stage longer, which causes the entire apparatus to grow in size and weight.

Furthermore, when the stage grows in size and weight in the stage device, a drive force required to drive the stage also increases. Accordingly, the drive mechanism to drive the stage grows in size and also heat generated from the drive mechanism increases, and therefore, there is a risk that the heat affects the substrate and the periphery thereof, which lowers the exposure accuracy.

SUMMARY OF THE INVENTION

The present invention has been made in consideration of the situation described above, and according to a first aspect of the present invention, there is provided a first movable body apparatus, comprising: a movable body that can move; a support device that supports an empty weight of the movable body, and can move; and a drive device that drives the movable body and also drives the support device according to movement of the movable body.

With this apparatus, since the movable body and the support device that supports the empty weight of the movable body are made up of separate bodies, the size and weight of the movable body (a structure including the movable body) can be decreased compared with the case where the movable body and the support device are integrally configured. Further, since the support device is moved by the drive device according to movement of the movable body, the movable body can be moved without difficulty even when the movable body and the support device are made up of separate bodies.

According to a second aspect of the present invention, there is provided a second movable body apparatus, comprising: a movable body that can move; a support device that supports an empty weight of the movable body, and can move; and a drive device that drives the movable body by movement of the support device and relative movement of the movable body and the support device.

With this apparatus, since the movable body and the support device that supports the empty weight of the movable body are configured of separate bodies, the size and weight of the movable body (a structure including the movable body) can be decreased compared with the case where the movable body and the support device are integrally configured. Further, since the drive device moves the movable body by movement of the support device and relative movement of the movable body and the support device, a drive force by the drive device that is made to act directly on the movable body can be reduced. Accordingly, the size of the drive device to be placed in the vicinity of the movable body can be decreased, and as a consequence, it becomes possible to reduce the influence of the heat generated from the drive device on the periphery of the movable body.

According to a third aspect of the present invention, there is provided a third movable body apparatus, comprising: a base having a guiding surface; a movable body that can move relative to the base; and a support device that supports an empty weight of the movable body and can move on the guiding surface according to movement of the movable body, wherein the movable body is supported by the support device so that the movable body can overhang the guiding surface.

According to a fourth aspect of the present invention, there is provided a pattern forming apparatus that forms a pattern on an object, the apparatus comprising: any one of the first to third movable body apparatus of the present invention, in which the object is held on the movable body; and a patterning device that forms the pattern on the object.

With this apparatus, since the pattern forming apparatus is equipped with any one of the first to third movable body apparatus, position controllability of the object is improved according to the downsizing of the movable body, which makes it possible to perform high-precision pattern formation. Further, by the downsizing of the entire movable body apparatus, the downsizing of the pattern forming apparatus can also be enhanced.

According to a fifth aspect of the present invention, there is provided a first pattern forming method, comprising: forming a pattern on an object using the pattern forming apparatus of the present invention. With this method, it becomes possible to perform the pattern formation on the object with high precision.

According to a sixth aspect of the present invention, there is provided a device manufacturing method using the first pattern forming method of the present invention.

According to a seventh aspect of the present invention, there is provided a manufacturing method of a movable body apparatus, comprising: providing a base having a guiding surface; providing a movable body that can move relative to the base; and providing a support device that supports an empty weight of the movable body, can move on the guiding surface according to movement of the movable body, and supports the movable body so that the movable body can overhang the guiding surface.

According to an eighth aspect of the present invention, there is provided a first movable body drive method, comprising: supporting an empty weight of a movable body by a support device that can move; and driving the movable body and also driving the support device according to movement of the movable body.

According to a ninth aspect of the present invention, there is provided a second movable body drive method, comprising: supporting an empty weight of a movable body by a support device that can move; and driving the movable body by movement of the support device and relative movement of the movable body and the support device.

According to a tenth aspect of the present invention, there is provided a third movable body drive method, comprising: supporting an empty weight of a movable body by a support device that can move; and moving the support device on a guiding surface of a base, wherein the movable body is supported by the support device so that the movable body can overhang the guiding surface.

According to an eleventh aspect of the present invention, there is provided a second pattern forming method of forming a pattern on an object, the method comprising: driving a movable body that holds the object, by using any one of the first to third movable body drive methods of the present invention.

According to a twelfth aspect of the present invention, there is provided a device manufacturing method using the second pattern forming method of the present invention.

BRIEF DESCRIPTION OF THE DRAWINGS

In the accompanying drawings.

DESCRIPTION OF THE EMBODIMENTS

Figure 1:
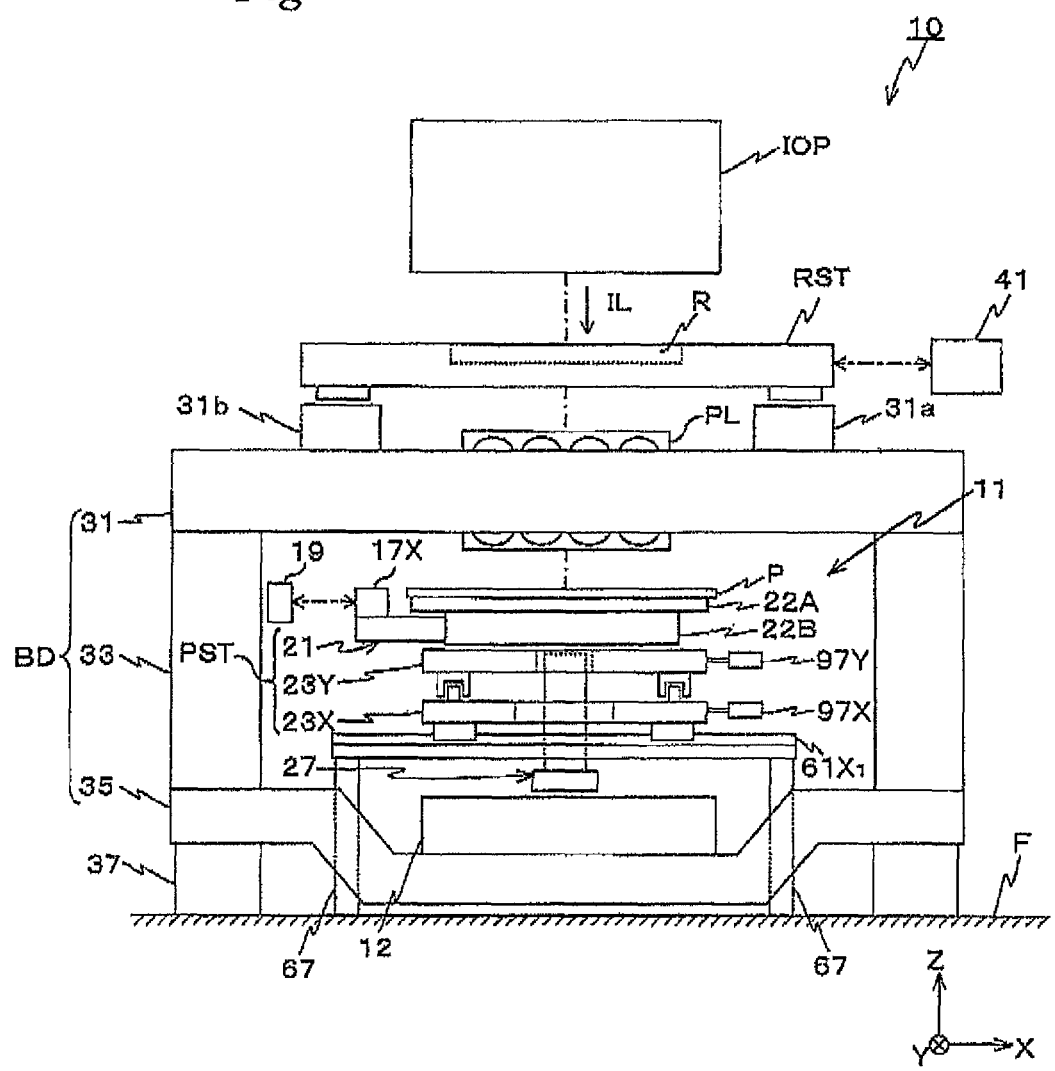
FIG. 1 is a view schematically showing a configuration of an exposure apparatus related to an embodiment.

An embodiment of the present invention is described below, with reference to FIGS. 1 to 5B. FIG. 1 shows a schematic configuration of an exposure apparatus 10 related to the embodiment. Exposure apparatus 10 is a projection exposure apparatus by a step-and-scan method, that is, a so-called scanning stepper.

As shown in FIG. 1, exposure apparatus 10 includes an illumination system IOP, a reticle stage RST that holds a reticle R, a projection optical system PL, a stage device 11 that holds a substrate P so that substrate P is movable along an XY plane, a body BD on which reticle stage RST, projection optical system PL, stage device 11 and the like are mounted, and their control system, and the like.

Illumination system IOP is configured similar to the illumination system that is disclosed in, for example, Kokai (Japanese Patent Unexamined Application Publication) No. 2001-313250 (the corresponding U.S. Patent Application Publication No. 2003/0025890), Kokai (Japanese Patent Unexamined Application Publication) No. 2002-006110 (the corresponding U.S. Patent Application Publication No. 2001/0033490), or the like. More specifically, illumination system IOP emits a coherent illumination light for exposure (illumination light) IL such as a laser beam toward reticle R. The wavelength of illumination light IL is, for example, 193 nm (ArF excimer laser beam).

Body BD includes a substrate stage frame 35 that is supported at a plurality of points (three or four points) by a plurality of (e.g. three or four) vibration isolating mechanisms 37 installed on a floor surface F (however, the vibration isolating mechanism in the depth of the page surface is not shown), and a barrel platform 31 that is horizontally supported via a plurality of (e.g. three or four) support members 33 on substrate stage frame 35 (however, support member 33 in the depth of the page surface is not shown). On the upper surface of substrate stage frame 35, a stage base 12 is installed.

On reticle stage RST, reticle R having a pattern surface (lower surface in FIG. 1) on which a circuit pattern and the like are formed is fixed by, for example, vacuum suction. Reticle stage RST is supported in a noncontact manner via an air pad (not shown) on protruding sections 31a and 31b that are integrally arranged on the upper surface of barrel platform 31 with a Y-axis direction serving as their longitudinal directions. Reticle stage RST is drivable in a predetermined scanning direction (which is to be the Y-axis direction orthogonal to the page surface of FIG. 1) at a designated scanning speed, and also is finely drivable in the XY plane, with a reticle stage drive system (not shown) including, for example, a linear motor or the like. Incidentally, it is also possible that barrel platform 31 and protruding sections 31a and 31b are constituted by different members, and a vibration isolating mechanism similar to vibration isolating mechanism 37 is arranged between barrel platform 31 and protruding sections 31a and 31b, respectively.

The position (including rotation about a Z-axis) of reticle stage RST in the XY plane is constantly detected at a resolution of, for example, around 0.5 to 1 nm with a reticle laser interferometer (hereinafter, referred to as a "reticle interferometer") 41, via a reflection surface (not shown) fixed (or formed) on the reticle stage. The measurement values of reticle interferometer 41 are sent to a main controller (not shown), and the main controller controls the position (and the speed) of reticle stage RST in the X-axis direction, the Y-axis direction, and a θz direction (a rotational direction about the Z-axis) via the reticle stage drive system, based on the measurement values of reticle interferometer 41.

Projection optical system PL is configured of a plurality of projection optical units that project a plurality of projected images, and is supported by barrel platform 31 below reticle stage RST, with the Z-axis direction serving as a direction of its optical axis. As projection optical system PL, for example, a dioptric system that is both-side telecentric and has a predetermined projection magnification (e.g. reduced magnification (e.g. one-quarter, one-fifth), equal magnification, or magnification). Therefore, when an illumination area on reticle R is illuminated with illumination light IL from illumination system IOP, illumination light IL having passed through reticle R whose pattern surface is placed substantially coincident with the first plane (object plane) of projection optical system PL forms a projected image (a partial upright image or a partial inverted image) of a circuit pattern of reticle R within the illumination area, on an irradiation area (exposure area) of illumination light IL that is conjugate to the illumination area, on substrate P which is placed on the second plane (image plane) side of projection optical system PL and whose surface is coated with a resist (photosensitive agent), via projection optical system PL. Then, by moving reticle R relative to the illumination area (illumination light IL) in the scanning direction (Y-axis direction) and also moving substrate P relative to the exposure area (illumination light IL) in the scanning direction (Y-axis direction) by synchronous drive of reticle stage RST and substrate stage PST, scanning exposure of one shot area (divided area) on substrate P is performed, and a pattern of reticle R is transferred to the shot area. More specifically, in the embodiment, a pattern is generated on substrate P by illumination system IOP, reticle R and projection optical system PL, and the pattern is formed on substrate P by exposure of a photosensitive layer (resist layer) on the substrate with illumination light IL.

Stage device 11 is placed on substrate stage frame 35, and includes substrate stage PST that moves in the XY plane while holding substrate P, and an empty-weight canceling mechanism (which is also referred to as a "central pillar") 27 that supports the empty weight of apart of substrate stage PST in a noncontact manner above stage base 12 mounted on substrate stage frame 35.

Substrate stage PST includes an X coarse movement stage 23X that is placed above stage base 12 and driven along the X-axis, a Y coarse movement stage 23Y that is placed above X coarse movement stage 23X and driven along the Y-axis relative to X coarse movement stage 23X, and a fine movement stage 21 that is placed on the +Z side (above) Y coarse movement stage 23Y and has a substrate table 22A that holds substrate P in a part thereof.

Figure 2:
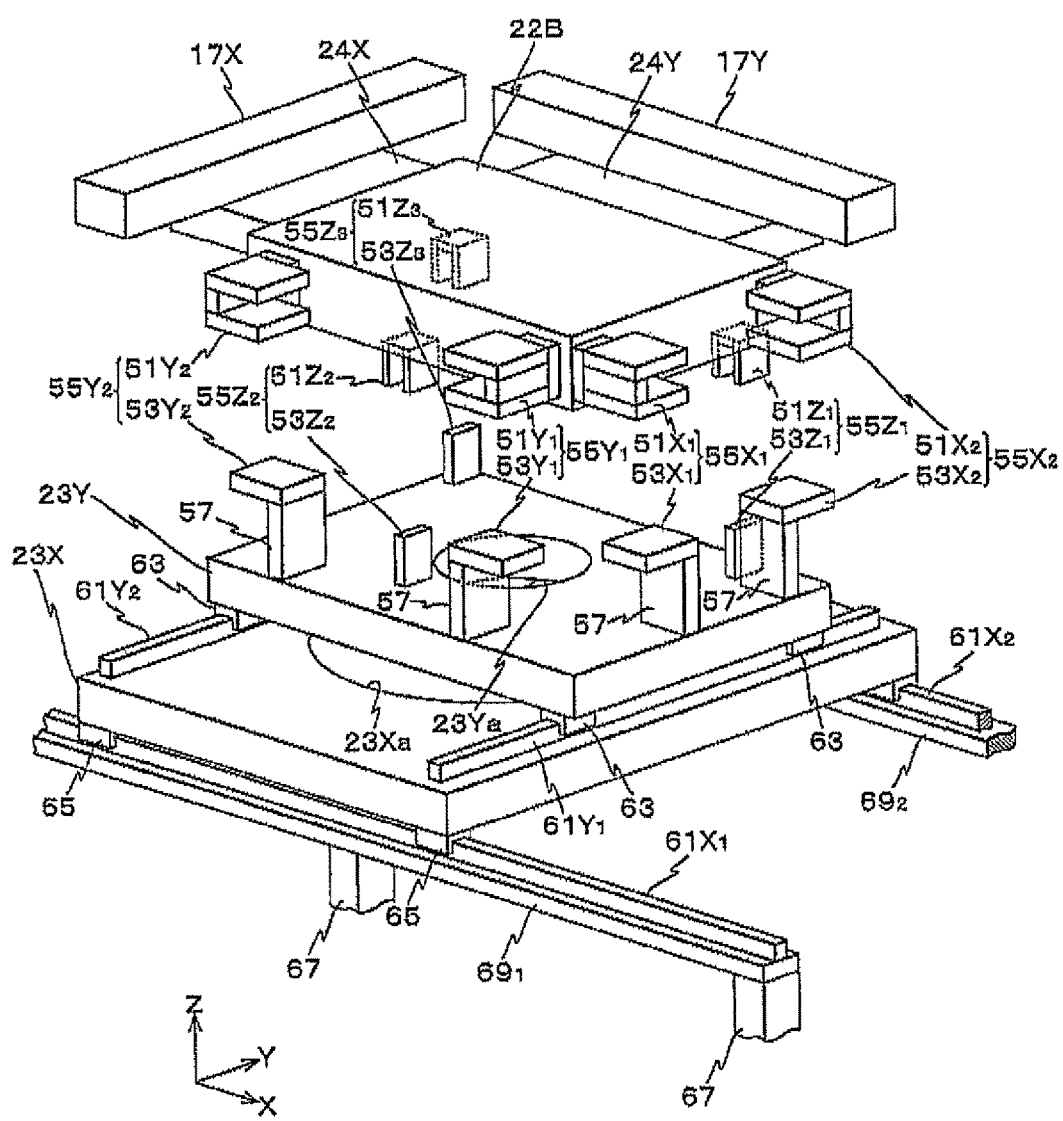
FIG. 2 is an exploded perspective view showing a substrate stage that constitutes a part of a stage device in FIG. 1, with partial omission.

The respective sections constituting substrate stage PST are specifically described below. FIG. 2 shows a perspective view of substrate stage PST, from which substrate table 22A and empty-weight canceling mechanism 27 are removed and which is partially exploded.

As shown in FIG. 2, X coarse movement stage 23X is composed of a plate-like member having a rectangular shape in a planar view (viewed from the Z-axis direction), and has a through-hole 23Xa having a circular shape in a planar view (viewed from the Z-axis direction) formed in its center portion. At four corner portions of the lower surface of X coarse movement stage 23X, X sliders 65 are respectively arranged (however, X slider 65 arranged on the corner portion in the depth of the page surface is not shown). Of these X sliders, two X sliders 65 on the −Y side are in a state of engaging with an X guide $61X_1$ whose longitudinal direction is in the X-axis direction and two X sliders 65 on the +Y side are in a state of engaging with an X guide $61X_2$ whose longitudinal direction is in the X-axis direction that is placed at a position a predetermined distance spaced apart on the +Y side from X guide $61X_1$. X slider 65 includes a rolling guide, in which a plurality of balls roll and circulate, inside thereof, and the rolling guide is formed on the +Y side surface and the −Y side surface of X guide $61X_1$ (or $61X_2$). Accordingly, by a drive force in the X-axis direction by an X drive mechanism 97X (refer to FIG. 1) including a ball screw acting on X coarse movement stage 23X, X coarse movement stage 23X is driven along X guides $61X_1$ and $61X_2$ (along the X-axis direction). Incidentally, each X slider 65 can be an air guide that blows out a gas to the +Y side surface and the −Y side surface of X guide $61X_1$ (or $61X_2$). In this case, a predetermined clearance is formed between each X slider 65, and the +Y side surface and the −Y side surface of X guide $61X_1$ (or $61X_2$).

One X guide, X guide $61X_1$ is supported from the lower side by a plate-shaped member $69_1$ whose longitudinal direction is in the X-axis direction, and the other X guide, X guide $61X_2$ is supported from the lower side by a plate-shaped member $69_2$ whose longitudinal direction is in the X-axis direction. And, each of plate-shaped members $69_1$ and $69_2$ is supported by a plurality of support legs 67 above floor surface F (refer to FIG. 1).

As shown in FIG. 2, Y coarse movement stage 23Y placed above X coarse movement stage 23X is composed of a plate-like member having a rectangular shape in a planar view (viewed from the Z-axis direction) that has an area size smaller than X coarse movement stage 23X, and has a through-hole 23Ya formed in its center portion. At four corner portions of the lower surface of Y coarse movement stage 23Y, Y sliders 63 are respectively arranged (however, Y slider 63 arranged on the corner portion in the depth of the page surface is not shown). Of these Y sliders, two Y sliders 63 on the +X side are in a state of engaging with a Y guide $61Y_1$ arranged near the +X side end of the upper surface of X coarse movement stage 23X with the Y-axis direction serving as its longitudinal direction and two Y sliders 63 on the −X side are in a state of engaging with a Y guide $61Y_2$ arranged near the −X side end of the upper surface of X coarse movement stage 23X with the Y-axis direction serving as its longitudinal direction. Y slider 63 includes a rolling guide, in which a plurality of balls roll and circulate, inside thereof, and the rolling guide is formed on the +X side surface and the −X side surface of Y guide $61Y_1$ (or $61Y_2$). Accordingly, by a drive force in the Y-axis direction by a Y drive mechanism 97Y (refer to FIG. 1) including a ball screw acting on Y coarse movement stage 23Y, Y coarse movement stage 23Y is driven along Y guides $61Y_1$ and $61Y_2$ (along the Y-axis direction). Incidentally, each Y slider 63 can be an air guide that blows out a gas to the +X side surface and the −X side surface of Y guide $61Y_1$ (or $61Y_2$). In this case, a predetermined clearance is formed between each Y slider 63, and the +X side surface and the −X side surface of Y guide 61Y$_1$ (or 61Y$_2$).

On the upper surface of Y coarse movement stage 23Y, seven stators in total (X stators 53X$_1$ and 53X$_2$, Y stators 53Y$_1$ and 53Y$_2$, and Z stators 53Z$_1$, 53Z$_2$ and 53Z$_3$) are arranged.

Of these stators, X stators 53X$_1$ and 53X$_2$ are respectively supported near the +X side end of the upper surface of Y coarse movement stage 23Y, by support member 57. An armature unit having a plurality of armature coils is arranged inside X stators 53X$_1$ and 53X$_2$.

Y stators 53Y$_1$ and 53Y$_2$ are respectively supported near the −Y side end of the upper surface of Y coarse movement stage 23Y, by support member 57. An armature unit having a plurality of armature coils is arranged inside Y stators 53Y$_1$ and 53Y$_2$, similarly to X stators 53X$_1$ and 53X$_2$ described above.

Z stators 53Z$_1$ to 53Z$_3$ are placed at three points that are not positioned in a straight line on the upper surface of Y coarse movement stage 23Y. Armature coils are arranged inside Z stators 53Z$_1$ to 53Z$_3$.

Referring back to FIG. 1, fine movement stage 21 described earlier includes substrate table 22A and a stage main section 22B that supports substrate table 22A from the lower side.

Substrate table 22A is composed of a rectangular-shaped member, and on the upper surface of substrate table 22A, a vacuum suction mechanism (or a substrate holder) used to hold substrate P by suction is arranged although not shown in the drawings.

As shown in FIG. 2, stage main section 22B is composed of a rectangular-shaped plate-like member, and a movable mirror (bar mirror) 17X is arranged on the side surface on the −X side of stage main section 22B via an attachment member 24X, and a movable mirror (bar mirror) 17Y is arranged on the side surface on the +Y side of main section 22B via an attachment member 24Y. The −X side surface of movable mirror 17X and the +Y side surface of movable mirror 17Y are mirror-polished and serve as reflection surfaces. Positional information of fine movement stage 21 in the XY plane is constantly detected at a resolution of, for example, around 0.5 to 1 nm with a substrate laser interferometer (hereinafter, referred to as a "substrate interferometer") 19 (refer to FIG. 1) that irradiates movable mirrors 17X and 17Y with measurement beams. In this case, although an X laser interferometer and a Y laser interferometer are actually arranged corresponding to X movable mirror 17X and Y movable mirror 17Y respectively, they are representatively shown as substrate interferometer 19 in FIG. 1.

X movers 51X$_1$ and 51X$_2$ each having a U-like sectional shape are fixed to the side surface on the +X side of stage main section 22B. A magnetic pole unit, which includes a plurality of permanent magnets (or a single permanent magnet) disposed along the X-axis direction, is respectively arranged on a pair of facing surfaces of each of X movers 51X$_1$ and 51X$_2$, though not shown in the drawing. X movers 51X$_1$ and 51X$_2$ engage with X stators 53X$_1$ and 53X$_2$, respectively, in a state where stage main section 22B and Y coarse movement stage 23Y are interlocked (the state shown in FIG. 1). Therefore, due to electromagnetic interaction between the electric current supplied to the armature units (armature coils) which X stators 53X$_1$ and 53X$_2$ have and the magnetic field formed in the internal space of the magnetic pole units which X movers 51X$_1$ and 51X$_2$ have, it is possible to make the drive force in the X-axis direction act on X movers 51X$_1$ and 51X$_2$. More specifically, in the embodiment, an X-axis linear motor 55X$_1$ is constituted by X mover 51X$_1$ and X stator 53X$_1$, and an X-axis linear motor 55X$_2$ is constituted by X mover 51X$_2$ and X stator 53X$_2$.

Further, Y movers 51Y$_1$ and 51Y$_2$ are fixed to the side surface on the −Y side of stage main section 22B. A magnetic pole unit, which includes a plurality of permanent magnets (or a single permanent magnet) disposed along the Y-axis direction, is respectively arranged on a pair of facing surfaces of each of Y movers 51Y$_1$ and 51Y$_2$. Y movers 51Y$_1$ and 51Y$_2$ engage with Y stators 53Y$_1$ and 53Y$_2$, respectively, in a state where stage main section 22B and Y coarse movement stage 23Y are interlocked (the state shown in FIG. 1). Therefore, due to electromagnetic interaction between the electric current supplied to the armature units (armature coils) of Y stators 53Y$_1$ and 53Y$_2$ and the magnetic field formed in the internal space of the magnetic pole units of Y movers 51Y$_1$ and 51Y$_2$, it is possible to make the drive force in the Y-axis direction act on Y movers 51Y$_1$ and 51Y$_2$. More specifically, in the embodiment, a Y-axis linear motor 55Y$_1$ is constituted by Y mover 51Y$_1$ and Y stator 53Y$_1$, and a Y-axis linear motor 55Y$_2$ is constituted by Y mover 51Y$_2$ and Y stator 53Y$_2$.

Further, on the lower surface (the surface on the −Z side) of stage main section 22B, Z movers 51Z$_1$, 51Z$_2$ and 51Z$_3$ each having an XZ sectional surface of a roughly inversed U-like shape are arranged. Permanent magnets are arranged on a pair of facing surfaces of each of Z movers 51Z$_1$ to 51Z$_3$. Z movers 51Z$_1$ to 51Z$_3$ engage with Z stators 53Z$_1$ to 53Z$_3$, respectively, in a state where fine movement stage 21 and Y coarse movement stage 23Y are interlocked (the state shown in FIG. 1). Therefore, due to electromagnetic interaction between the electric current supplied to the armature coils of Z stators 53Z$_1$ to 53Z$_3$ and the magnetic field formed in the internal space of Z movers 51Z$_1$ to 51Z$_3$, it is possible to make the drive force in the Z-axis direction act on Z movers 51Z$_1$ to 51Z$_3$. More specifically, in the embodiment, a Z-axis linear motor 55Z$_1$ is constituted by Z mover 51Z$_1$ and Z stator 53Z$_1$, and a Z-axis linear motor 55Z$_2$ is constituted by Z mover 51Z$_2$ and Z stator 53Z$_2$, and further a Z-axis linear motor 55Z$_3$ is constituted by Z mover 51Z$_3$ and Z stator 53Z$_3$.

As is described above, since X-axis linear motors 55X$_1$ and 55X$_2$, Y-axis linear motors 55Y$_1$ and 55Y$_2$, and Z-axis linear motors 55Z$_1$ to 55Z$_3$ are arranged between fine movement stage 21 (stage main section 22B) and Y coarse movement stage 23Y, fine movement stage 21 (stage main section 22B) can be finely drive in the X-axis, Y-axis and Z-axis directions, relative to Y coarse movement stage 23Y. Further, by making the respective drive forces of X-axis linear motors 55X$_1$ and 55X$_2$ (or the respective drive forces of Y-axis linear motors 55Y$_1$ and 55Y$_2$) be different, fine movement stage 21 (stage main section 22B) carne finely driven in a rotational direction about the Z-axis (θz direction), relative to Y coarse movement stage 23Y, and by making the respective drive forces of Z-axis linear motors 55Z$_1$ to 55Z$_3$ be different, fine movement stage 21 (stage main section 22B) can be finely driven in a rotational direction about the X-axis (θx direction) and a rotational direction about the Y-axis (θy direction), relative to Y coarse movement stage 23Y. Incidentally, although FIG. 2 shows the X-axis and Y-axis linear motors arranged on the side surfaces on the +X side and the −Y side of fine movement stage 21, the linear motors can be placed dispersedly on the three sides or the four sides. Further, at least a part of the magnetic pole units and the armature units can have the inversed positional relations with the positional relations described above.

Next, empty-weight canceling mechanism 27 is described with reference to FIGS. 3 to 5B.

Figure 3:
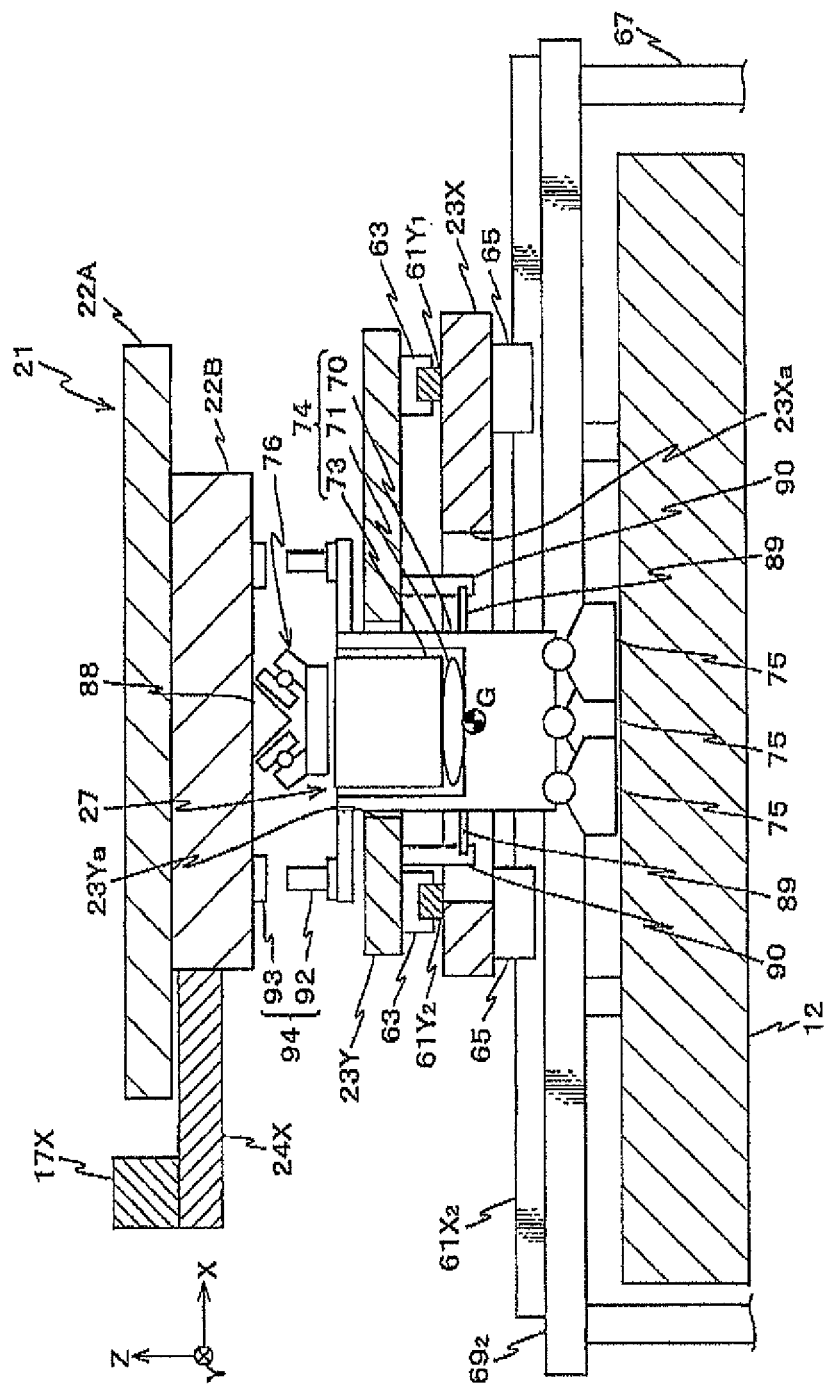
FIG. 3 is a longitudinal sectional view showing the stage device in FIG. 1.

FIG. 3 shows a state where the X-axis linear motors, the Y-axis linear motors and the Z-axis linear motors are removed from stage device 11, in a sectional view.

As shown in FIG. 3, fine movement stage 21 includes substrate table 22A, stage main section 22B and an inclination permissive section 76 arranged below stage main section 22B. Further, empty-weight cancelling mechanism 27 is placed in a state of penetrating through-hole 23Xa formed in X coarse movement stage 23X and through-hole 23Ya formed in Y coarse movement stage 23Y described earlier. Empty-weight cancelling mechanism 27 includes: a main section 74 which has a housing 70, an air spring 71 arranged inside housing 70 and a slide section 73 that is vertically movable in the Z-axis direction; and three base pads 75 arranged at the lower end of main section 74.

Figure 4A:
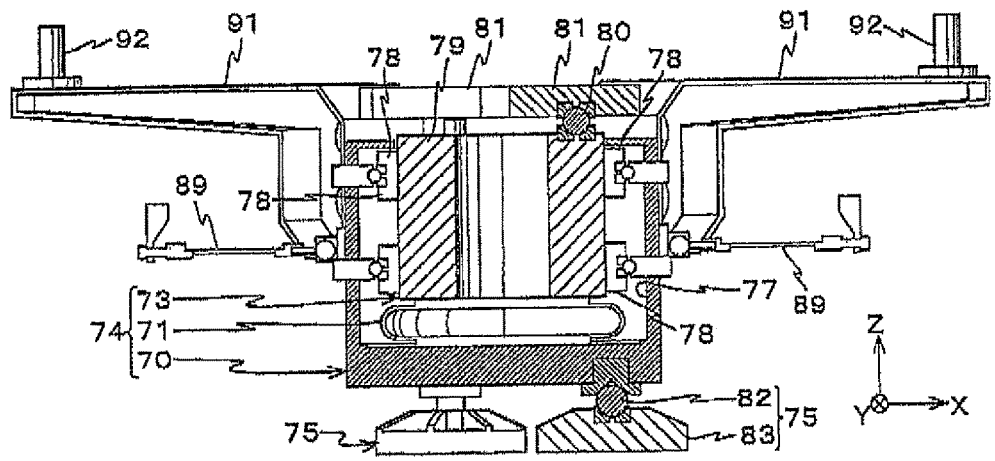
FIG. 4A is a longitudinal sectional view showing an empty-weight canceling mechanism in FIG. 1.
Figure 4B:
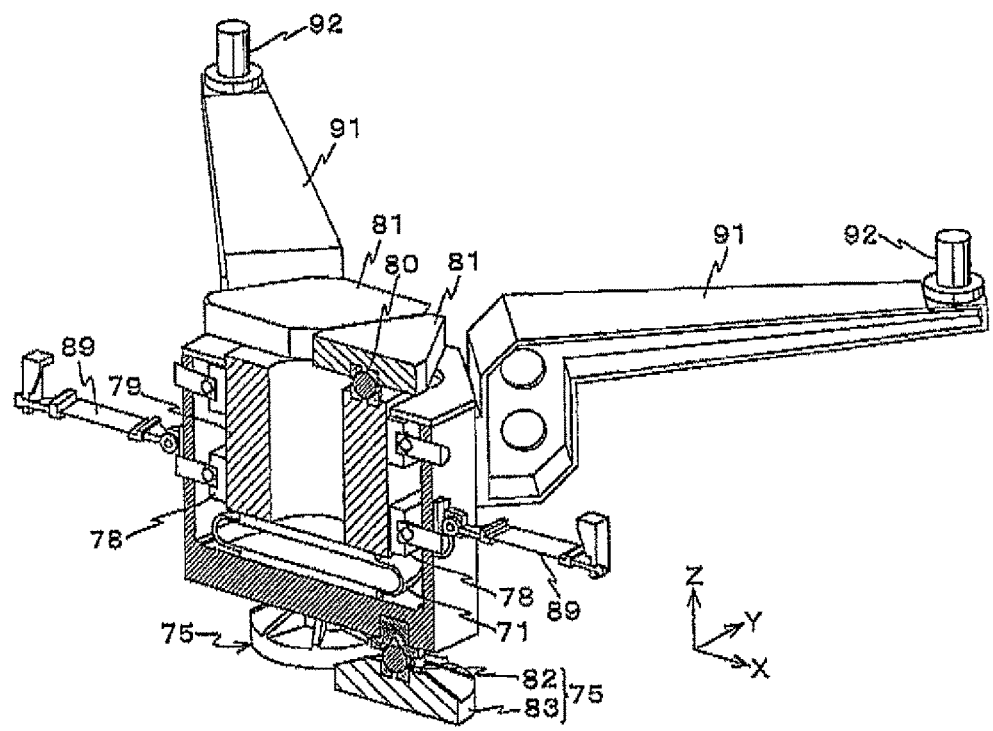
FIG. 4B is a perspective view showing the empty-weight canceling mechanism with partial fracture.

As can be seen from FIGS. 4A and 4B that show empty-weight cancelling mechanism 27 with partial fracture, housing 70 has a space 77 inside, and a plurality of (four in FIGS. 4A and 4B) air pads 78 are placed in space 77.

Further, one ends of four flexures 89 are respectively fixed to the outer periphery of housing 70 with a predetermined spacing. The other ends of flexures 89 are connected respectively to four support members 90 arranged on the lower surface of Y coarse movement stage 23Y, as shown in FIG. 3. More specifically, housing 70 is connected to Y coarse movement stage 23Y via flexures 89, and therefore housing 70 is in a state of being restrained in the X-axis and Y-axis directions and not being restrained in the Z-axis, θx, θy and θz directions due to the action of rigidity and hinge joint of members of flexures 89. As shown in FIG. 3, flexures 89 are connected to housing 70 at the height position (Z-position) that is substantially the same as the height position of the center of gravity G of empty-weight cancelling mechanism 27.

Air spring 71 is arranged at the lowermost section in space 77 inside housing 70. A gas is supplied from a gas supplying device (not shown) to air spring 71, and accordingly, the inside of air spring 71 is set to be a positive pressure space in which the atmospheric pressure is higher than in the outside.

As shown in FIG. 4A, slide section 73 has: a slide section main body 79 having a rectangular parallelepiped shape; and three pad members 81 each having a roughly rhombus shape in a planar view (viewed from the +Z direction) (refer to FIG. 4B) that are fixed to the upper end of slide section main body 79 via ball-and-socket joints (ball joints) 80, respectively. Each pad member 81 can change its attitude in an inclination direction with respect to the XY plane by ball joint 80. A gas can be blown out from the upper surfaces (+Z side surfaces) of pad members 81 to the lower surface of inclination permissive section 76 shown in FIG. 3, and because of the static pressure of the gas between the lower surface of inclination permissive section 76 and the respective pad members 81, a predetermined clearance is formed between the upper surface of pad member 81 and the lower surface of inclination permissive section 76.

The outer peripheral surface of slide section main body 79 faces each of a plurality of air pads 78 arranged inside housing 70 described earlier. Therefore, a predetermined clearance is formed between the outer peripheral surface of slide section main body 79 and the respective bearing surfaces of air pads 78. Accordingly, in the embodiment, it is possible to perform slide drive of slide section 73 in the Z-axis direction according to the pressure in air spring 71.

As shown in FIGS. 4A and 4B, each base pad 75 includes: a base pad main body 83; and ball-and-socket joint (ball joint) 82 that links base pad main body 83 with the lower surface of housing 70. Each base pad main body 83 can form a predetermined clearance between the base pad main body 83 and the upper surface of stage base 12 by blowing out a gas to the upper surface of stage base 12. More specifically, each base pad main body 83 functions as a hydrostatic gas bearing that forms a predetermined clearance by the static pressure of the gas between the lower surface of the base pad main body 83 and the upper surface of stage base 12. Further, each base pad main body 83 can change its attitude in the inclination direction with respect to the XY plane by ball joint 82.

Referring back to FIG. 3, inclination permissive section 76 is arranged between a triangular-pyramid-shaped member 88 arranged on the lower surface of stage main section 22B of fine movement stage 21 and slide section 73 (to be more specific, three pad members 81 shown in FIG. 4A). Inclination permissive section 76 is supported in a noncontact manner by three pad members 81 described previously. More specifically, stage main section 22B is supported by a plurality of planar bearings. In other words, the position of inclination permissive section 76 relative to main section 74 in the XY plane can be changed.

Figure 5A:
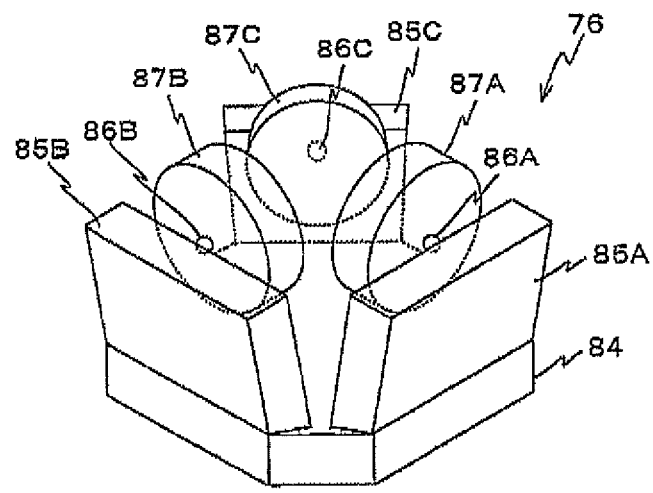
FIG. 5A is a perspective view showing an inclination permissive section in FIG. 3.

As shown in a perspective view of FIG. 5A, inclination permissive section 76 includes: a foundation section 84; three support sections 85A to 85O arranged on the upper surface of foundation section 84; hinges (or ball joints) 86A to 86O arranged at the respective support sections 85A to 85C; and pad sections 87A to 87C fixed to hinges (or ball joints) 86A to 86C respectively.

Figure 5B:
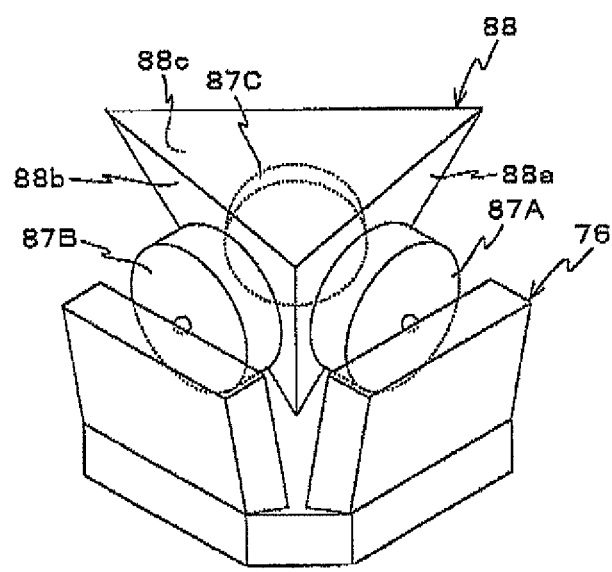
FIG. 5B is a perspective view showing a state where the inclination permissive section and a triangular-pyramid-shaped member are combined.

As shown in FIG. 5B, each of pad sections 87A to 87C faces each of surfaces 88a to 88c of triangular-pyramid-shaped member 88 and can blow out a gas to each of surfaces 88a to 88c. Therefore, because of the static pressure of the gas blown out from the respective pad sections 87A to 87C, a predetermined clearance is formed between each of pad sections 87A to 87C and each of the facing surfaces. Further, since pad sections 87A to 87C are attached to support sections 85A to 85C via hinges (or ball joints) 86A to 86C, triangular-pyramid-shaped member 88 is supported in a state where movement in the θx, θy and θz directions is permitted by inclination permissive section 76.

With empty-weight cancelling mechanism 27 having the above-described configuration, the empty weight of fine movement stage 21 is supported by the positive pressure inside air spring 71, and a predetermined clearance is constantly formed between empty-weight cancelling mechanism 27 and stage base 12 by the action of three base pads 75. Further, inclination permissive section 76, which is noncontact with both triangular-pyramid-shaped member 88 arranged on the lower surface of fine movement stage 21 and empty-weight cancelling mechanism 27, is present between them, and therefore, the empty weight of fine movement stage 21 can be supported by empty-weight cancelling mechanism 27 in a state where movement (movement by a minutely small amount) of fine movement stage 21 in the inclination direction and in the XY plane is permitted.

Further, the configuration is employed in which, of vibration propagating to empty-weight cancelling mechanism 27, vibration in directions other than the X-axis direction, the Y-axis direction and the θz direction is not transmitted to fine movement stage 21, since empty-weight cancelling mechanism 27 is noncontact with fine movement stage 21.

Furthermore, as is described earlier, since empty-weight cancelling mechanism 27 is coupled with Y coarse movement stage 23Y via flexures 89 of which the restraint force in directions other then X-axis and Y-axis directions is substantially zero (refer to FIGS. 3 and 4A), a vibration component in the Z-axis direction, the θx direction, the θy direction and the θz direction, which is a part of vibration from Y coarse movement stage 23Y, is hart to be transmitted to empty-weight cancelling mechanism 27. As a consequence, vibration except for vibration from stage base 12 is hard to be transmitted to fine movement stage 21.

Referring back to FIGS. 4A and 4B, three arm sections 91 each having a roughly L-shaped sectional surface are fixed to housing 70 (however, the arm section located on the front side of the page surface is not shown). A probe section 92 is arranged at one end of each of arm sections 91. As shown in FIG. 3, target sections 93 are arranged above probe sections 92. Capacitance sensors (Z sensors) 94, which can measure a distance between probe section 92 and target section 93, are configured including probe sections 92 and target sections 93. In this case, probe sections 92 constituting Z sensor 94 are arranged on a part of empty-weight cancelling mechanism 27, and the constant attitude of empty-weight cancelling mechanism 27 is maintained at all times relative to the upper surface of stage base 12, and therefore, by using the measurement result obtained by Z sensors 94, the Z-position of fine movement stage 21 can be computed (converted) with the upper surface of stage base 12 serving as a reference. Further, because three Z sensors 94 are arranged as is described above, the attitude in directions inclined with respect to the XY plane can also be computed with the upper surface of stage base 12 serving as a reference, by using the measurement result of three Z sensors 94. Incidentally, in the embodiment, not three, but four arm sections 91 each having a roughly L-shaped section surface can be arranged at housing 70. And, the positional relation between probe sections 92 and target sections 93 can be inversed. Further, the number of Z sensors 94 is not limited to three but can be four, and the measurement method of Z sensor 94 is not limited to the capacitance sensor but can be a laser displacement meter by a CCD method or the like. Incidentally, the relative positional relation between empty-weight cancelling mechanism 27 and fine movement stage 21 can be obtained using Z sensors 94.

Referring back to FIG. 1, in exposure apparatus 10 having the configuration as described above, reticle R is loaded onto reticle stage RST by a reticle loader (not shown) and substrate P is loaded onto fine movement stage 21 by a substrate loader (not shown). Subsequently, the main controller executes alignment measurement using an alignment detection system (not shown), and after the alignment measurement is completed, performs an exposure operation by a step-and-scan method. Since this exposure operation is similar to the step-and-scan method conventionally performed, the description thereof is omitted herein.

While the alignment operation and the exposure operation are performed, the main controller (not shown) performs drive control of X coarse movement stage 23X and Y coarse movement stage 23Y via X drive mechanism 97X and Y drive mechanism 97Y that include the ball screws, based on the measurement values of interferometer 19, and also performs position control of fine movement stage 21 (substrate P) via X-axis linear motors $55X_1$ and $55X_2$, Y-axis linear motors $55Y_1$ and $55Y_2$ and Z-axis linear motors $55Z_1$ to $55Z_3$, based on the measurement values of interferometer 19 and the measurement values of three Z sensors 94. More specifically, in the embodiment, substrate P is moved (and the position of substrate P is set) in the XY plane, by respectively moving X coarse movement stage 23X, Y coarse movement stage 23Y and empty-weight cancelling mechanism 27 in the XY plane with a long stroke and also by finely moving fine movement stage 21 relative to X coarse movement stage 23X, Y coarse movement stage 23Y and empty-weight cancelling mechanism 27.

As is described in detail above, according to the embodiment, empty-weight cancelling mechanism 27 that supports the empty-weight of fine movement stage 21 is configured of a separate body from fine movement stage 21, and therefore, the size and weight of fine movement stage 21 (the structure including fine movement stage 21) can be reduced, compared with the case where fine movement stage 21 and empty-weight cancelling mechanism 27 are integrally configured. Accordingly, the position controllability (including the position setting accuracy) of fine movement stage 21 is improved, which makes it possible to improve the exposure accuracy of exposure apparatus 10.

Further, by movement of X coarse movement stage 23X and Y coarse movement stage 23Y by X drive mechanism 97X and Y drive mechanism 97Y, fine movement stage 21 is driven in the XY plane and empty-weight cancelling mechanism 27 that supports the empty-weight of fine movement stage 21 is also driven, and therefore, fine movement stage 21 can be driven without difficulty even when fine movement stage 21 and empty-weight cancelling mechanism 27 are made up of separate bodies.

Further, according to the embodiment, drive control of fine movement stage 21 is performed, by driving fine movement stage 21 and empty-weight cancelling mechanism 27 in the XY plane via X drive mechanism 97X and Y drive mechanism 97Y, and also by finely driving fine movement stage 21 and empty-weight cancelling mechanism 27, relatively, in directions of six degrees of freedom via X-axis linear motors $55X_1$ and $55X_2$, Y-axis linear motors $55Y_1$ and $55Y_2$ and Z-axis linear motors $55Z_1$ to $55Z_3$. Accordingly, the size of the drive mechanisms ($55X_1$ and $55X_2$, $55Y_1$ and $55Y_2$, and $55Z_1$ to $55Z_3$) to be arranged in the vicinity of fine movement stage 21 can be reduced, and therefore, the influence on substrate P of heat generated by the drive mechanisms (i.e. influence on the exposure accuracy) can be reduced. Further, because the drive mechanisms can be placed at the height that is substantially the same as the position of center of gravity in the height direction (Z-axis direction), drive of the center of gravity can be performed, which allows the stable attitude to be maintained.

Further, according to the embodiment, when fine movement stage 21 moves above stage base 12, the empty-weight of fine movement stage 21 is constantly supported by empty-weight cancelling mechanism 27. More specifically, by setting the −Z side surface of empty-weight cancelling mechanism 27 (the −Z side surfaces of base pad main bodies 83), which faces the +Z side surface of stage base 12, to be small, it becomes possible to decrease the area size of the +Z side surface of stage base 12, which allows the size of stage device 11, and hence the size of the entire exposure apparatus 10 to be reduced, as a consequence.

Figure 6A:
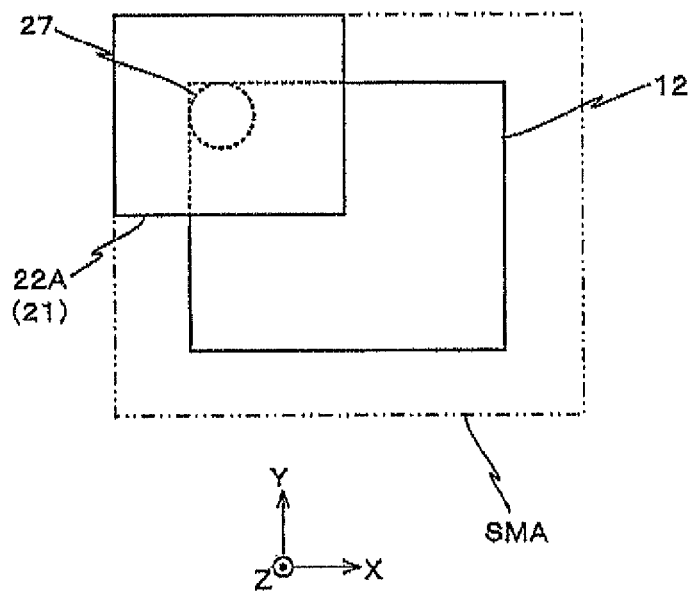
FIGS. 6A and 6B are views used to explain a state where the substrate table is supported by the empty-weight canceling mechanism while a part of the substrate table protrudes outside from a stage base.

For example, as shown in a simplified manner in FIG. 6A, the configuration is employed in which the rough center of substrate table 22A (fine movement stage 21) in the XY plane is supported by empty-weight cancelling mechanism 27 and empty-weight cancelling mechanism 27 includes the position of center of gravity in the XY plane of substrate table 22A (fine movement stage 21). With this configuration, the size of an area where the −Z side surface of empty-weight cancelling mechanism 27 (the −Z side surface of base pad main body 83) is projected on the upper surface (guiding surface) of stage base 12 is smaller than the size of an area where substrate table 22A (fine movement stage 21) is projected on the upper surface (guiding surface) of stage base 12, and the area where empty-weight cancelling mechanism 27 is projected is positioned substantially in the center of the area where substrate table 22A (fine movement stage 21) is projected.

Figure 6B:
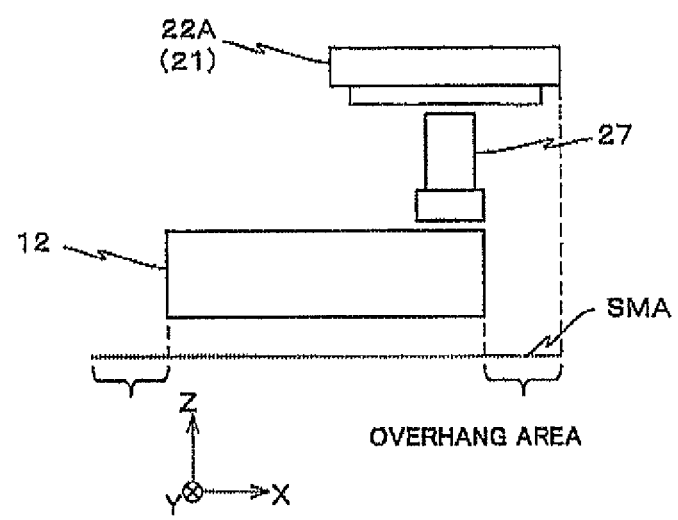

Accordingly, as shown in FIG. 6B, even if empty-weight cancelling mechanism 27 is located at the edge of the upper surface (guiding surface) of stage base 12, substrate table 22A (fine movement stage 21) is located in a state (overhang state) of overhanging the upper surface (guiding surface) of stage base 12, in the XY plane. More specifically, substrate table 22A (fine movement stage 21) can move in a range larger than the upper surface (guiding surface) of stage base 12 in the XY plane, and therefore, when a stage movable area, i.e. a predetermined movement area SMA (refer to FIG. 6A) of substrate table 22A (fine movement stage 21) is set, the area size of the upper surface (guiding surface) of stage base 12 can be set smaller than the area size of movement area SMA.

Further, according to the embodiment, empty-weight cancelling mechanism 27 is connected to Y coarse movement stage 23Y via flexures 89, and therefore, the vibration in the Z-axis, θx, θy and θz directions is hard to be transmitted between empty-weight cancelling mechanism 27 and Y coarse movement stage 23Y. Accordingly, shake (vibration in a broad sense) in the Z-axis, θx, θy and θz directions, which propagates to Y coarse movement stage 23Y, is hard to be transmitted to empty-weight cancelling mechanism 27.

Further, according to the embodiment, fine movement stage 21 is connected in a noncontact manner to each of the linear motors that drive fine movement stage 21 in directions of six degrees of freedom and drive mechanisms 97X and 97Y including the ball screws that drive empty-weight cancelling mechanism 27 in directions of two degrees of freedom, so as to be separated from the linear motors and drive mechanisms 97X and 97Y vibrationwise, and therefore, high-precision drive (position setting) of fine movement stage 21 can be performed.

Further, according to the embodiment, stage device 11 is equipped with capacitance sensors (Z sensors) 94 that include probe sections 92 arranged on empty-weight cancelling mechanism 27 and target sections 93 arranged on fine movement stage 21, and can measure a distance between probe section 92 and target section 93. Accordingly, since the constant attitude of empty-weight cancelling mechanism 27 is maintained relative to the upper surface of stage base 12, the measurement result of Z sensors 94 can be converted into the Z position of fine movement stage 21, with the upper surface of stage base 12 serving as a reference. With this operation, it is possible to measure the attitude of fine movement stage 21 (substrate P) in the direction inclined with respect to XY plane, with the upper surface of stage base 12 serving as a reference.

Figure 7A:
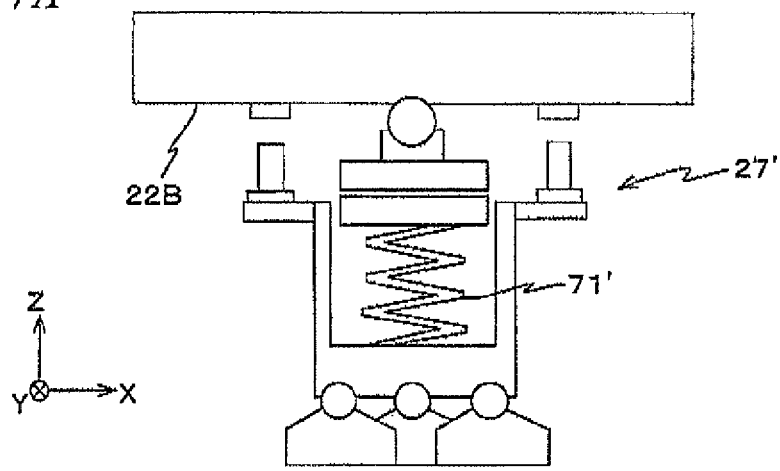
FIGS. 7A to 7C are views showing modified examples of the empty-weight canceling mechanism.

Incidentally, in the embodiment above, although empty-weight cancelling mechanism 27 including air spring 71 inside is employed, this is not intended to be limiting, and for example, as shown in FIG. 7A, an empty-weight cancelling mechanism 27' that has an elastic member 71' such as a coil spring, instead of air spring 71, can be employed.

Figure 7B:
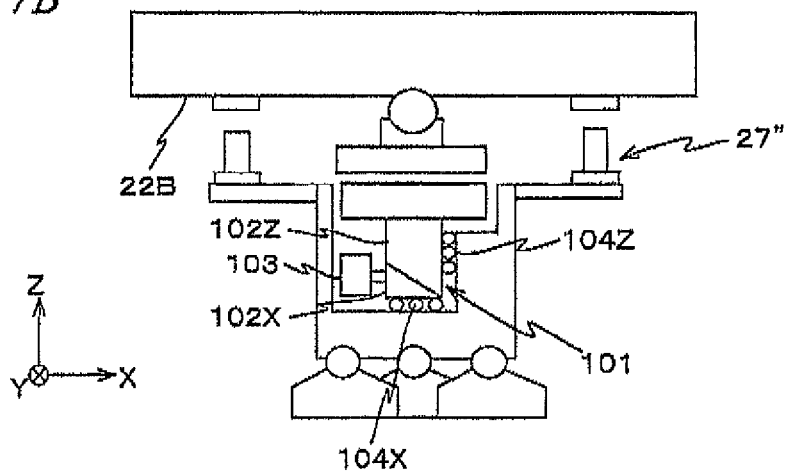

Further, an empty-weight cancelling mechanism 27" that has a Z drive mechanism 101 as shown in FIG. 7B, instead of the air spring and the elastic member, can be employed. Z drive mechanism 101 includes: an X slider 102X having a right-angled triangle shape when viewed from the +Y side; a Z slider 102Z having a trapezoidal shape when viewed from the +Y direction that is mounted on the +Z side of X slider 102X; and an X drive section 103 that gives a drive force in the X-axis direction to X slider 102X. And, X slider 102X is slidable in the X-axis direction with a bearing 104X, and Z slider 102Z is slidable in the Z-axis direction with a bearing 104Z.

Figure 7C:
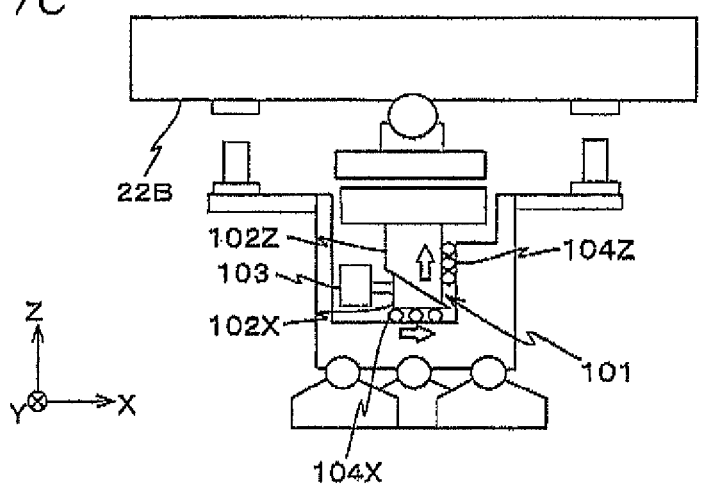

With Z drive mechanism 101, since X slider 102X and Z slider 102Z contact with each other via the respective inclined surfaces, Z slider 102Z can be moved in the +Z direction by moving X slider 102X in the +X direction using X drive section 103, by the principle of wedge, as shown in FIG. 7C.

Incidentally, in the embodiment above, the case has been described where Y coarse movement stage 23Y and empty-weight cancelling mechanism 27 are coupled by flexures 89, as shown in FIG. 3, but this is not intended to be limiting, and for example, both of them can be coupled using plate springs, or both of them can be coupled using wire ropes. Further, the restraint of empty-weight cancelling mechanism 27 can be performed by using the static pressure of the air pads, the electromagnetic force generated by the linear motors, the magnetic force, or the like. Incidentally, although a spherical bearing is shown in FIGS. 7A to 7C as the means to support stage main section 22B in an inclinable manner, this spherical bearing can be used instead of inclination permissive section 76 in FIG. 3.

Figure 8:
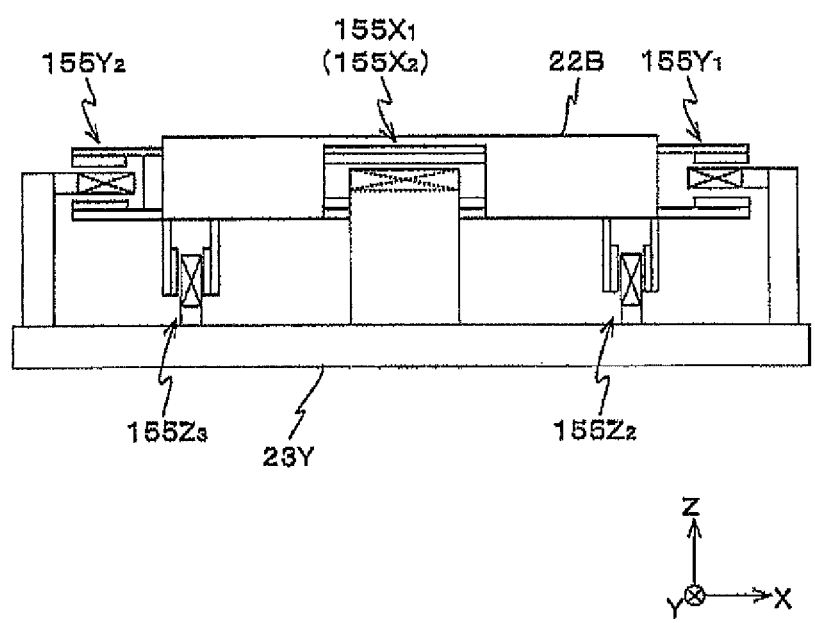
FIG. 8 is a view used to explain a placement of linear motors related to a modified example.

Further, in the embodiment above, although X-axis linear motors $55X_1$ and $55X_2$, Y-axis linear motors $55Y_1$ and $55Y_2$ and Z-axis linear motors $55Z_1$ to $55Z_3$ are arranged in the placement as shown in FIG. 2, this it not intended to be limiting, and for example, the placement as shown in FIG. 8 can be employed. More specifically, as shown in FIG. 8, it is also possible that X-axis linear motors $155X_1$ and $155X_2$ are placed on the side surface on the +Y side and the side surface on the −Y side of stage main section 22B, Y-axis linear motors $155Y_1$ and $155Y_2$ are placed on the side surface on the +X side and the side surface on the −X side of stage main section 22B. With this placement as well, the drive of fine movement stage 21 can be performed in a similar manner to the manner in the embodiment above.

Incidentally, in the embodiment above, the configuration is employed in which inclination permissive section 76 has hinges (or ball joints) 86A to 86C and three pad sections 87A to 87C, as shown in FIGS. 5A and 5B, but this is not intended to be limiting, and for example, a configuration, in which the hinges (or ball joints) are arranged between foundation section 84 and fine movement stage 21 (stage main section 22B), can also be employed.

Figure 9A:
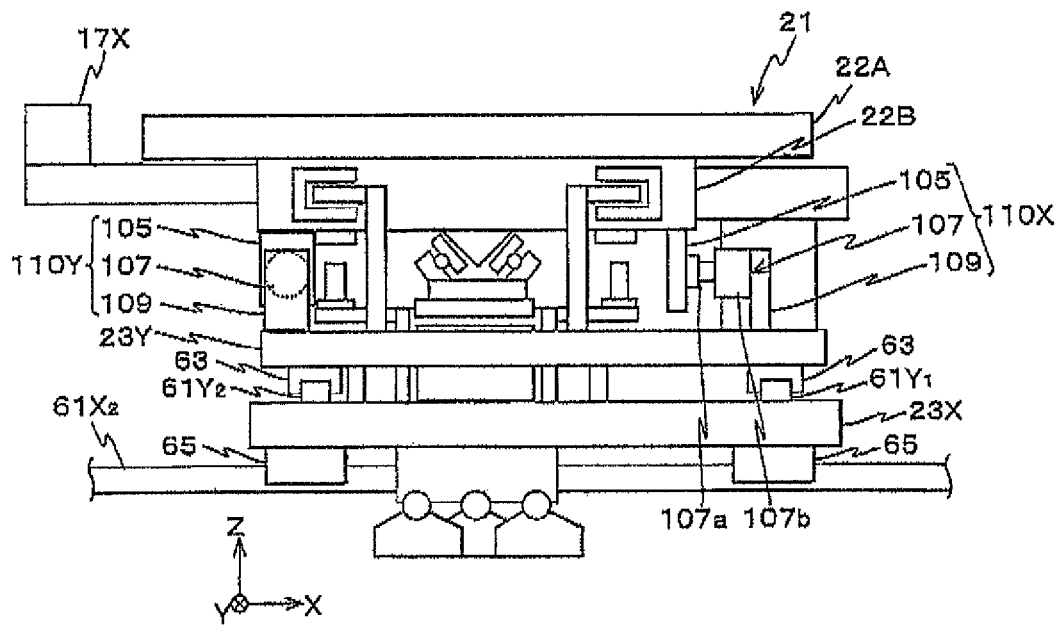
FIGS. 9A and 9B are views used to explain a placement and a configuration of a stage coupling mechanism.
Figure 9B:
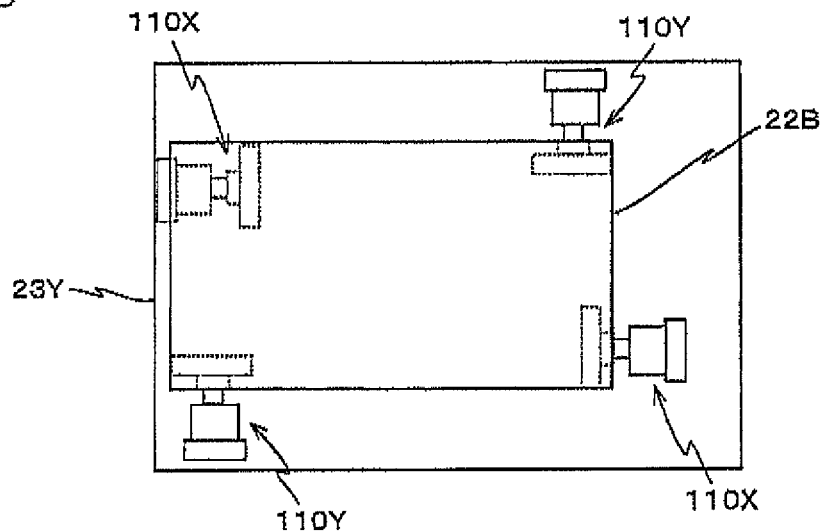

Incidentally, one each pair of stage coupling mechanism 110X and a stage coupling mechanism 110Y as shown in FIGS. 9A and 9B can be arranged on stage device 11.

Of these stage coupling mechanisms, stage coupling mechanism 110X can employ a configuration that includes a first plate-like member 105 fixed to the lower surface of stage main section 22B that constitutes fine movement stage 21, a second plate-like member fixed to the upper surface of Y coarse movement stage 23Y, and a piston mechanism 107 fixed to the −X side surface of second plate-like member 109, as shown in FIG. 9A. Pistonmechanism 107 has a cylinder 107b, and a piston rod 107a having a piston (not shown) at its one end that is movable in the X-axis direction along the inner circumferential surface of cylinder 107b is fixed. Further, the similar configuration can be employed also for stage coupling mechanism 110Y.

Figure 10A:
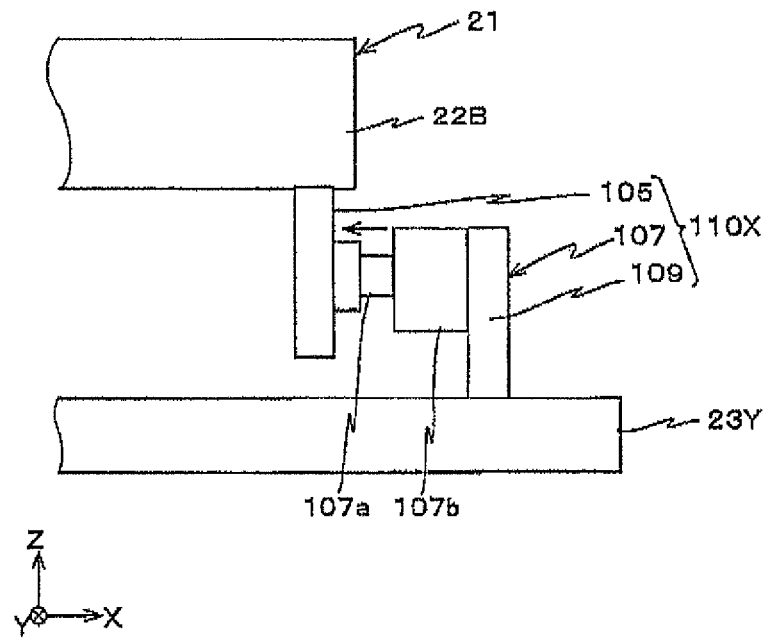
FIGS. 10A and 10B are views used to explain an action of the stage coupling mechanism.
Figure 10B:
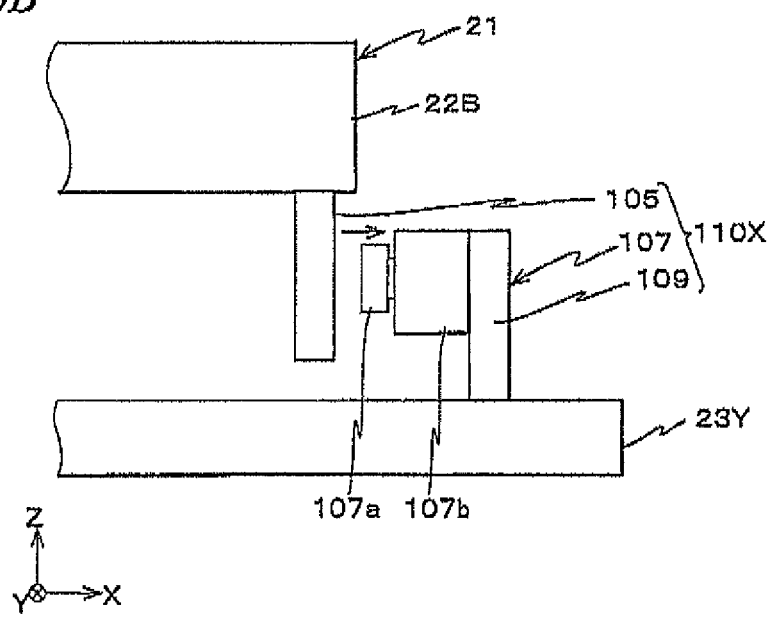

With this stage coupling mechanism (e.g. stage coupling mechanism 110X), as shown in FIG. 10A, by supplying a gas into an internal space of cylinder 107b to move piston rod 107a in the −X direction via the piston, the other end of piston rod 107a can be made to contact with the +X side surface of first plate-like member 105. Further, as shown in FIG. 10B, by decreasing the gas present in the internal space of cylinder 107b to move piston 107a in the +X direction, piston rod 107a can be made to be away from first plate-like member 105.

With this operation, in the cases such as where exposure by a step-and-scan method is performed as in the embodiment above, when acceleration movement of substrate P (fine movement stage 21) is performed, the acceleration movement is performed in a state where fine movement stage 21 and Y coarse movement stage 23Y are coupled using stage coupling mechanisms 110X and 110Y, as shown in FIG. 10A. When the acceleration movement is completed and then shifts to constant speed movement, as shown in FIG. 10B, the coupling by stage coupling mechanisms 110X and 110Y is released to uncouple Y coarse movement stage 23Y and fine movement stage 21, and the position control of fine movement stage 21 is performed with X-axis linear motors $55X_1$ and $55X_2$, Y-axis linear motors $55Y_1$ and $55Y_2$, and Z-axis linear motors $55Z_1$ to $55Z_3$ described previously.

With this operation, it becomes unnecessary to make the respective motors ($55X_1$, $55X_2$, $55Y_1$ and $55Y_2$), which perform the position control of fine movement stage 21, generate the drive force used to make fine movement stage 21 follow X and Y coarse movement stages 23X and 23Y, during the acceleration (during non-exposure). Therefore, the maximum generating thrust force required for the respective motors ($55X_1$, $55X_2$, $55Y_1$ and $55Y_2$) can be small, which enhances the downsizing of the motors. Accordingly, the weight of the entire stage device 11 can be decreased, and also the influence of heat generated by the motors on the exposure accuracy can be reduced. Further, the cost of the motors can also be lowered.

Incidentally, in FIGS. 9A and 9B, stage coupling mechanisms 110X and 110Y are both arranged, but this is not intended to be limiting, and either one of them (e.g. only stage coupling mechanism 110Y) can be arranged.

Further, the configuration of stage coupling mechanisms 110X and 110Y is not limited to the one described above, but for example, a configuration can also be employed in which the stages can be coupled and uncoupled by combination of a permanent magnet and an electromagnet, and other configurations can be employed.

Figure 11:
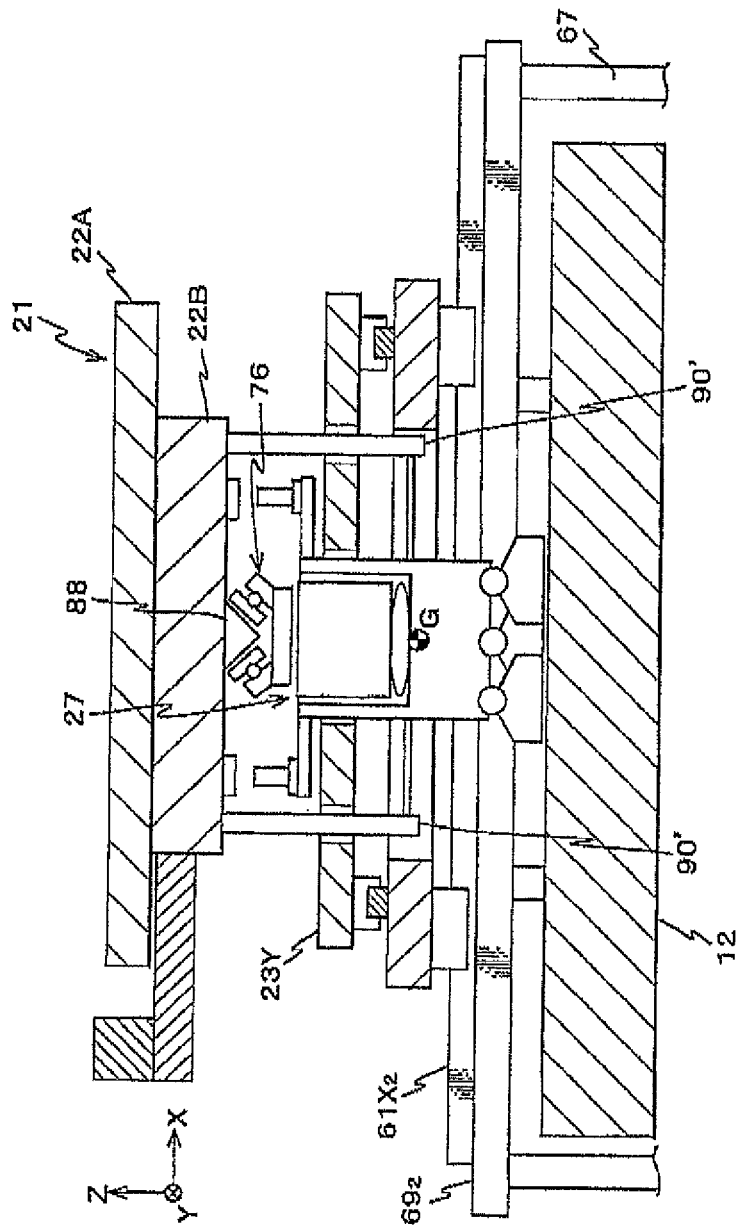
FIG. 11 is a view showing a modified example of a restraining method of the empty-weight canceling mechanism.

Incidentally, in the embodiment above, although the case has been described where empty-weight cancelling mechanism 27 is connected to Y coarse movement stage 23Y as shown in FIG. 3, this is not intended to be limiting, and as shown in FIG. 11, a configuration can also be employed in which empty-weight cancelling mechanism 27 is connected to a connecting member 90' arranged on the lower side of fine movement stage 21 (to be more precise, of stage main section 22B). In this case, empty-weight cancelling mechanism 27 and connecting member 90' can be connected (restrained in the XY plane) by flexures, similarly to the embodiment above. Alternatively, empty-weight cancelling mechanism 27 and connecting member 90' can be mechanically connected by plate springs, or can be connected (restrained in the XY plane) by the static pressure of the air pads, the electromagnetic force generated by the linear motors, or the means to generate a force such as a magnetic force.

Incidentally, in the embodiment above, as illumination light IL, a harmonic wave, which is obtained by amplifying a single-wavelength laser beam in the infrared or visible range emitted by a DFB semiconductor laser or fiber laser, with a fiber amplifier doped with, for example, erbium (or both erbium and ytteribium), and by converting the wavelength into ultraviolet light using a nonlinear optical crystal, can also be used.

Further, in the embodiment above, as illumination light IL, an emission line in the ultraviolet region (such as a g-line (wavelength: 436 nm), an h line (wavelength: 405 nm) or an i line (wavelength: 365 nm)) generated by an extra-high pressure mercury lamp can also be used. Further, the light source is not limited to the ArF excimer laser or the extra-high pressure mercury lamp, but a light source that generates a vacuum ultraviolet light such as a KrF excimer laser light with a wavelength of 248 nm, an $F_2$ laser light with a wavelength of 157 nm, a $Kr_2$ excimer laser light with a wavelength of 146 nm or an $Ar_2$ excimer laser light with a wavelength of 126 nm can also be used. Further, a solid-state laser (output wavelength: 355 nm or 260 nm) or the like can also be used.

Further, in the embodiment above, the case has been described where the present invention is applied to a scanning exposure apparatus, but this is not intended to be limiting, and the present invention is suitably applied to an exposure apparatus by a step-and-repeat method (a so-called stepper), an exposure apparatus by a step-and-stitch method, an exposure apparatus by a proximity method, a mirror projection aligner or the like.

Incidentally, in the embodiment above, a transmissive type mask, which is a transmissive mask substrate on which a predetermined light shielding pattern (or a phase pattern or a light attenuation pattern) is formed, is used. Instead of this mask, however, as is disclosed in, for example, U.S. Pat. No. 6,778,257, an electron mask (variable shaped mask) on which a light-transmitting pattern, a reflection pattern, or an emission pattern is formed according to electronic data of the pattern to be exposed can also be used. For example, a variable shaped mask that uses a DMD (Digital Micromirror Device) that is a type of a non-emission type image display device (which is also called a spatial light modulator) can be used.

In addition, the present invention can also be applied to an exposure apparatus such as a liquid immersion type exposure apparatus in which a space between a projection optical system and a substrate is filled with a liquid, which is disclosed in, for example, International publication No. 2004/053955 (the corresponding U.S. Patent Application Publication No. 2005/0259234) and the like.

The use of the exposure apparatus is not limited to the exposure apparatus for liquid crystal display devices that transfers a liquid crystal display device pattern onto a rectangular glass plate, but the present invention can also be widely applied, for example, to an exposure apparatus for manufacturing semiconductors, and an exposure apparatus for producing thin-film magnetic heads, micromachines, DNA chips, and the like. Further, the present invention can be applied not only to an exposure apparatus for producing microdevices such as semiconductor devices, but can also be applied to an exposure apparatus that transfers a circuit pattern onto a glass substrate or silicon wafer to produce a reticle or a mask used in a light exposure apparatus, an EUV exposure apparatus, an X-ray exposure apparatus, an electron-beam exposure apparatus, and the like. Incidentally, a substrate that is subject to exposure is not limited to a glass plate, but for example, can be a wafer or the like.

Incidentally, the exposure apparatus that forms a pattern on a substrate has been described above, but the method to form the pattern on the substrate with a scanning operation can be achieved not only by the exposure apparatus, but also a device manufacturing apparatus equipped with a functional liquid imparting device with an inkjet method similar to the inkjet head group, which is disclosed in, for example, Kokai (Japanese Patent Unexamined Application Publication) No. 2004-130312 and the like.

The inkjet head group disclosed in the above publication has a plurality of inkjet heads that discharge a predetermined functional liquid (such as a metal-containing liquid or a photosensitive material) from a nozzle (discharging outlet) and impart the liquid to a substrate (e.g. PET, glass, silicon, paper or the like). The functional liquid imparting device like this inkjet head group can be prepared and used for generating the pattern. In the device manufacturing apparatus equipped with this functional liquid imparting device, it is possible that the functional liquid imparting device is scanned in a scanning direction while a substrate is fixed, or it is also possible that the substrate and the functional liquid imparting device are scanned in the directions opposite to each other.

For example, in the case of manufacturing a liquid crystal display device, the liquid crystal display device is manufactured through the following steps: a pattern forming step, which includes the respective processing processes such as a so-called optical lithography process where a pattern is formed on a photosensitive substrate (such as a glass substrate coated with a resist) using the various types of exposure apparatus described above (a process where a predetermined pattern including many electrodes and the like is formed on the photosensitive substrate), a development process of the exposed substrate, an etching process, and a resist removing process; a color filter forming step of forming a color filter in which many sets of three dots corresponding to R (Red), G (Green) and B (blue) are disposed in a matrix shape, or a plurality of sets of three stripes of R, G and B are disposed in horizontal scanning line directions; a cell assembling step where a liquid crystal panel (liquid crystal cell) is assembled using the substrate having the predetermined pattern obtained in the pattern forming step, the color filter obtained in the color filter forming step, and the like; a module assembling step where a liquid crystal display device is completed by attaching an electric circuit that makes a display operation of the assembled liquid crystal panel (liquid crystal cell) perform and respective components such as a backlight. In this case, in the pattern forming step, exposure of a plate is performed with high throughput, by using the various types of exposure apparatus described above (including exposure apparatus 10 of the embodiment above), and as a consequence, the productivity of the liquid crystal display devices can be improved.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. A movable body apparatus, comprising:
    a first movable body that is movable in a state of holding a substrate;
    a first support section that supports the first movable body;
    a support device that supports the first movable body and is supported by the first support section in a noncontact manner, the support device being relatively movable with respect to the first support section in a state of supporting the first movable body;
    a second movable body that has a first drive section and a second drive section, the first drive section driving the first movable body and the support device in a first direction, the second drive section driving the first drive section, the first movable body and the support device in a second direction in a state of supporting the first drive section, and the second direction intersecting the first direction;
    a second support section that is provided spaced apart from the first support section, and supports the second movable body; and
    a coupling device that couples the first movable body and the second movable body in a manner in which the first movable body and the second movable body can be decoupled, wherein
    the support device is provided facing the first movable body, and is arranged movable on the first support section, relative to each of the first movable body and the second movable body, and
    the second movable body:
        moves on the second support section and causes the first movable body to move at a first speed, in a state in which the first movable body and the second movable body are coupled with each other by the coupling device; and
        moves on the second support section and causes the first movable body to move at a second speed, in a state in which coupling between the first movable body and the second movable body is released by the coupling device, the second speed being different from the first speed.

2. The movable body apparatus according to claim 1, wherein the second movable body performs:
    acceleration movement of the first movable body at the first speed, and
    constant speed movement of the first movable body at the second speed.

3. The movable body apparatus according to claim 1, wherein the second movable body causes the support device to move relative to the first support section so that the support device maintains support of the first movable body.

4. The movable body apparatus according to claim 1, wherein the support device is coupled with the first drive section to be movable relative to the first drive section in a vertical direction, and is vibrationally separated from the first drive section in the vertical direction.

5. The movable body apparatus according to claim 1, wherein the coupling device couples the first movable body and the second movable body so that the first and the second movable bodies are not relatively moved in the first direction and the second direction.

6. The movable body apparatus according to claim 1, wherein the first movable body is rotationally movable with respect to three axes that are orthogonal to one another, and the three axes include at least an axis parallel to a vertical direction.

7. The movable body apparatus according to claim 1, further comprising:
    a measurement device that is provided between the first movable body and the support device and measures a position of the first movable body in a vertical direction with respect to the support device.

8. The movable body apparatus according to claim 1, wherein the first support section has a guiding surface,
the support device is moved on the guiding surface by the second movable body, and
the first movable body is supported by the support device so that the first movable body can overhang the guiding surface.

9. The movable body apparatus according to claim 8, wherein an area where the first movable body can move is larger than the guiding surface.

10. The movable body apparatus according to claim 8, wherein the support device has a guiding section that faces the guiding surface in a noncontact manner, and
a projection area of the support device is smaller than a projection area of the first movable body, the projection area being an area on the guiding surface where the support device or the first movable body is projected from a support direction in which the support device supports the first movable body.

11. A pattern forming apparatus that forms a pattern on a substrate, the apparatus comprising:
the movable body apparatus according to claim 1, in which the substrate is held on the first movable body; and
a patterning device that forms a pattern on the substrate.

12. The pattern forming apparatus according to claim 11, wherein the patterning device forms the pattern by irradiating the substrate with exposure light.

13. A movable body drive method, comprising:
a first support process of supporting a first movable body that holds a substrate, with a first support section;
a second support process of supporting the first movable body, with a support device that is supported by the first support section in a noncontact manner and is relatively movable with respect to the first support section in a state of supporting the first movable body;
a drive process of driving the first movable body and the support device in a first direction, by a first drive section of a second movable body, and driving the first drive section, the first movable body and the support device in a second direction, by a second drive section of the second movable body in a state of supporting the first drive section, the second direction intersecting the first direction; and
a third support process of supporting the second movable body, with a second support section that is provided spaced apart from the first support section,
wherein the support device is provided facing the first movable body, and is arranged movable on the first support section, relative to each of the first movable body and the second movable body, and
the drive process includes:
a process of moving the first movable body at a first speed by the second movable body that moves on the second support section, in a state in which the first movable body and the second movable body are coupled with each other by a coupling device, and
a process of moving the first movable body at a second speed by the second movable body that moves on the second support section, in a state in which coupling between the first movable body and the second movable body is released by the coupling device, the second speed being different from the first speed.

14. The movable body drive method according to claim 13, wherein acceleration movement of the first movable body is performed at the first speed, and
constant speed movement of the first movable body is performed at the second speed.

15. The movable body drive method according to claim 13, wherein in the drive process, the support device is moved relative to the first support section so that the support device maintains support of the first movable body.

16. The movable body drive method according to claim 13, wherein the support device is moved on a guiding surface of the first support section, by the second movable body, and
the first movable body is supported by the support device so that the first movable body can overhang the guiding surface.

17. The movable body drive method according to claim 16, wherein an area where the first movable body can move is larger than the guiding surface.

18. The movable body drive method according to claim 16, wherein the support device has a guiding section that faces the guiding surface in a noncontact manner, and
a projection area of the support device is smaller than a projection area of the first movable body, the projection area being an area on the guiding surface where the support device or the first movable body is projected from a support direction in which the support device supports the first movable body.

19. A pattern forming method of forming a pattern on a substrate, the method comprising:
a process of driving the first movable body that holds the substrate, with the movable body drive method according to claim 13; and
a process of forming a pattern on the substrate using a patterning device.

20. The pattern forming method according to claim 19, wherein the patterning device forms the pattern by irradiating the substrate with exposure light.

21. The movable body drive method according to claim 13, wherein the first movable body and the second movable body are coupled, by the coupling device so that the first and the second movable bodies are not relatively moved in the first direction and the second direction.

* * * * *

UNITED STATES PATENT AND TRADEMARK OFFICE
CERTIFICATE OF CORRECTION

PATENT NO. : 10,228,625 B2
APPLICATION NO. : 15/153244
DATED : March 12, 2019
INVENTOR(S) : Yasuo Aoki et al.

Page 1 of 1

It is certified that error appears in the above-identified patent and that said Letters Patent is hereby corrected as shown below:

On page 2, Column 2, Line 19, Under Item (56), Other Publications:
Change "March 10, 2015 Office Action issued in U.S. Appl. No. 121553,549."
To --March 10, 2015 Office Action issued in U.S. Appl. No. 12/553,549.--

Signed and Sealed this
Fourteenth Day of May, 2019

Andrei Iancu
*Director of the United States Patent and Trademark Office*